United States Patent
Van Den Brink

(10) Patent No.: US 9,222,995 B2
(45) Date of Patent: Dec. 29, 2015

(54) APPARATUS AND METHOD FOR DISPENSING A HYPERPOLARIZED FLUID

(75) Inventor: Johan Samuel Van Den Brink, Meteren (NL)

(73) Assignee: Koninklijke Philips N.V., Eindhoven (NL)

( * ) Notice: Subject to any disclaimer, the term of this patent is extended or adjusted under 35 U.S.C. 154(b) by 703 days.

(21) Appl. No.: 13/579,133

(22) PCT Filed: Feb. 4, 2011

(86) PCT No.: PCT/IB2011/050480
§ 371 (c)(1),
(2), (4) Date: Oct. 19, 2012

(87) PCT Pub. No.: WO2011/101765
PCT Pub. Date: Aug. 25, 2011

(65) Prior Publication Data
US 2013/0200895 A1    Aug. 8, 2013

(30) Foreign Application Priority Data

Feb. 16, 2010    (EP) .................................... 10153668

(51) Int. Cl.
*G01R 33/28* (2006.01)
*G01R 33/56* (2006.01)

(52) U.S. Cl.
CPC ............ *G01R 33/281* (2013.01); *G01R 33/282* (2013.01); *G01R 33/5601* (2013.01)

(58) Field of Classification Search
CPC .................................................... G01R 33/281
USPC ................................. 324/313, 318
See application file for complete search history.

(56) References Cited

U.S. PATENT DOCUMENTS

| 6,159,444 A | 12/2000 | Schlenga |
| 6,278,893 B1 * | 8/2001 | Ardenkjær-Larson et al. .............................. 600/420 |
| 6,295,834 B1 * | 10/2001 | Driehuys ......................... 62/637 |
| 6,611,540 B1 * | 8/2003 | Mueller .......................... 372/35 |

(Continued)

FOREIGN PATENT DOCUMENTS

| SU | 494646 A1 | 12/1975 |
| WO | 2007136439 A1 | 11/2007 |

(Continued)

OTHER PUBLICATIONS

Bowers, C. R., et al.; Cross polarization from laser-polarized solid xenon to 13CO2 by low-field thermal mixing; Chemical Physics Letters, North-Holland, Amsterdam, NL, vol. 205, No. 2/03, Apr. 9, 1993, pp. 168-170.

(Continued)

*Primary Examiner* — Rodney Fuller

(57) ABSTRACT

A dispenser is provided for producing a nuclear hyperpolarized contrast agent. The dispenser comprises a chamber to receive a compound. A photonic hyperpolarization system generates an OAM-photonic beam endowed with orbital angular momentum and is arranged to direct the OAM-photonic beam into the chamber so as to generate nuclear hyperpolarization in the compound. The chamber has an output over which the hyperpolarized compound can be issued. Since the hyperpolarization is generated ex-vivo, the penetration depth of the OAM-photonic beam in biological tissue is irrelevant for the present invention.

20 Claims, 3 Drawing Sheets

(56) References Cited

U.S. PATENT DOCUMENTS

| | | | |
|---|---|---|---|
| 6,648,130 B1* | 11/2003 | Hasson et al. | 206/0.7 |
| 7,382,124 B2 | 6/2008 | Hattori | |
| 2003/0077224 A1* | 4/2003 | Pines et al. | 424/9.3 |
| 2004/0265179 A1* | 12/2004 | Nelson et al. | 422/83 |
| 2007/0038076 A1 | 2/2007 | Osada | |
| 2007/0156046 A1* | 7/2007 | Hasing et al. | 600/420 |
| 2007/0241752 A1* | 10/2007 | Meersmann et al. | 324/307 |
| 2009/0016964 A1 | 1/2009 | Kalechofsky et al. | |
| 2011/0050228 A1* | 3/2011 | Levitt et al. | 324/310 |
| 2011/0062392 A1* | 3/2011 | Kalechofsky et al. | 252/582 |
| 2011/0095759 A1* | 4/2011 | Bhattacharya et al. | 324/307 |
| 2011/0260076 A1* | 10/2011 | Hersman | 250/429 |
| 2014/0034481 A1* | 2/2014 | Waddell | 204/157.15 |

FOREIGN PATENT DOCUMENTS

| | | | |
|---|---|---|---|
| WO | 2009081360 A1 | 7/2009 | |
| WO | 2009090610 A1 | 7/2009 | |

OTHER PUBLICATIONS

Elgort, D. R., et al.; Direct Optical Hyperpolarization of Liquids; 2008; Proceedings of the International Society for Magnetic Resonance in Medicine, 16th Scientific Meeting and Exhibition, Toronto, Ontario, Canada, May 3-9, 2008, p. 3200.

Gallagher, F. A., et al.; Biomedical applications of hyperpolarized 13C magnetic resonance imaging; 2009; J. Prog. Nucl. Magn. Reson. Spectrosc.; doi:10.1016/i.pnmrs.2009.06.001.

Han, S-I., et al.; NMR-Based Biosensing with Optimized Delivery of Polarized 129Xe to Solutions; 2005; Analytical Chemistry, American Chemical Society, US, vol. 77(13)4008-4012.

Maly, T., et al.; Dynamic nuclear polarization at high magnetic fields; 2008; Journal of Chemical Physics; 128(5) 52211/1-19, Massachusetts, US.

Raftery, D., et al.; High-Field NMR of Adsorbed Xenon Polarized by Laser Pumping; 1991; Physical Review Letters; American Physical Society, NY, US, vol. 66(5)584-587.

Wu, X., et al.; Optical Pumping and MRI of Hyperpolarized Spins; 2003; Biomedical Photonics Handbook; CRC Press; US 28 pages.

Whitesides G.M. The origins and the future of microfluidics. Nature. Jul. 27, 2006;442(7101):368-73. Review. PubMed PMID: 16871203.

Levitt, M.H. Spin Dynamics. Basis of Nuclear Magnetic Resonance. Second Edition. The University of Southampton, UK. John Wiley & Sons. (2008) ISBN 978-0-470-51117-6.

Golay, X., et al. (2005), Pulsed star labeling of arterial regions (PULSAR): A robust regional perfusion technique for high field imaging. Magnetic Resonance Medicine, 53: 15-21. doi: 10.1002/mrm.20338.

* cited by examiner

APPARATUS AND METHOD FOR DISPENSING A HYPERPOLARIZED FLUID

CROSS-REFERENCE TO RELATED APPLICATIONS

This application is a national stage application under 35 U.S.C. §371 of International Application No. PCT/IB2011/050480 filed on Feb. 4, 2011 and published in the English language on Aug. 25, 2011 as International Publication No. WO/2011/101765, which claims priority to European Application No. 10153668.8 filed on Feb. 16, 2010, the entire disclosures of which are incorporated herein by reference.

FIELD OF THE INVENTION

The invention pertains generation of a hyperpolarised contrast agent. An optical system produces an OAM light-beam endowed with optical angular momentum. This OAM photonic beam generates nuclear hyperpolarisation in a compound which then can be employed as the hyperpolarised contrast agent in an MR examination.

BACKGROUND OF THE INVENTION

Such a photonic-based hyperpolarisation system is known from the international application WO2009/081360.

The known photonic-based hyperpolarisation system includes a surface probe with a light-output that directs light endowed with orbital angular momentum to penetrate tissue of a patient to be examined. In an alternative embodiment of the known light-based hyperpolarisation system a catheter is provided. These known applications of photonic-based hyperpolarisation generates the hyperpolarised contrast agent in the biological material and have only a short penetration depth for biological (i.e. human or animal) tissue. Hence, these known applications are limited to endoscopic, invasive and interventional applications.

SUMMARY OF THE INVENTION

An object of the invention is to provide a dispenser with a photonic-based hyperpolarisation system that is suitable for non-interventional application.

This object is achieved by a dispenser comprising
a chamber to receive a compound
a photonic hyperpolarisation system to generate an OAM-photonic beam endowed with orbital angular momentum and arranged to direct the OAM-photonic beam into the chamber so as to generate nuclear hyperpolarisation in the compound
and the chamber having an output over which the hyperpolarised compound can be issued.

The invention is based on the insight that the photonic-beam endowed with orbital angular momentum (OAM light beam) is employed to hyperpolarise a compound, e.g. a fluid substance in the chamber. The hyperpolarised compound functions as a contrast agent in an NMR or MRI experiment and is administered to an object, e.g. a patient to be examined. The beam-path of the OAM photonic beam and the NMR or MRI experiment are separated. Thus, any limitations in the penetration depth of the OAM light are taken into account in the dimensions of the chamber. The hyperpolarisation of the compound takes place in the chamber that is well accessible for the OAM-photonic beam, i.e. via a transparent window that conserves the orbital angular momentum of the OAM-photonic beam. Then the hyperpolarised compound is issued over the output of the chamber and may be administered as a contrast agent to the patient to be examined. In another implementation, the hyperpolarisation is transferred from a first hyperpolarised compound to a second receiving compound which is employed as the contrast agent. Since the hyperpolarisation is generated ex-vivo, the penetration depth of the OAM-photonic beam in biological tissue is irrelevant for the present invention. The chamber can be embodied as a separate container which receives the compound, in which the compound is hyperpolarised by the OAM photonic beam and subsequently dispensed as the contrast agent. Alternatively, the chamber can be an integral part of an infusion line along which the compound is transferred, hyperpolarised by the OAM photonic beam and dispensed as the contrast agent. The chamber, whether as the separate container or as the integral part of the infusion line preferably has dimensions of a few millimeters in all directions. Such a sized chamber is easily irradiated with about a thousand (1000) spots of the OAM photonic beam(s). For example 30×30 spots of 1 $mm^2$ can be used to hyperpolarise the compound over a depth of 1 mm. In this way 1 to 10 ml/s of the hyperpolarised compound can be produced. These and other aspects of the invention will be further elaborated with reference to the embodiments defined in the dependent Claims.

In a further aspect of the invention, the dispenser includes a polarisation transfer system. The compound in the chamber is a source-compound in which nuclear or electronic hyperpolarisation is generated by the OAM-photonic beam. In the polarisation transfer system, from this hyperpolarised source-compound the nuclear or electronic hyperpolarisation is transferred to a recipient-compound. This recipient-compound does not need to be present when the source-compound is hyperpolarised by the OAM photonic beam, but can be added later. Usually, the hyperpolarised nucleus in the source-compound is different from the hyperpolarised nucleus in the recipient-compound. In particular, in the source compound protons ($^1H$) are hyperpolarised by the OAM-photonic beam and this hyperpolarisation is transferred to e.g. a $^{13}C$, $^{15}N$, $^{17}O$ or $^{19}F$ nucleus of the recipient-compound. In particular the source compound can be water of which the protons ($^1H$) can be effectively polarised by the OAM photonic beam. These nuclei can and will be polarized directly through conservation of angular momentum, if present in the mixture during interaction with the OAM photonic beam.

The hyperpolarisation from the source-compound is transferred to the recipient-compound by the polarisation transfer system on the basis of e.g. the Overhauser effect or dynamic nuclear polarisation (DNP). Alternatively, to transfer polarization can be effected via exchange interactions in the same molecule, i.e. for example enhance the already enhanced 13C signal by additional transfer of the also enhanced $^1H$ signals. In this alternative, the source-compound and the recipient-compound in fact are the same, but the polarisation is transferred internally from a source-nucleus to a recipient in the same compound. For example, the OAM photonic beam polarises protons ($^1H$) in glucose and next the generated polarisation is transferred onto a Carbon-13 ($^{13}C$) nucleus of the glucose. The glucose with hyperpolarised $^{13}C$ is then diluted in a solution that is practical to administer as a contrast agent. Such polarisation transfer employs NMR pulse sequences like INEPT and other sequences know to those skilled in the art (see e.g. Spin Dynamics. Basis of Nuclear Magnetic Resonance, M. H. Levitt, Wiley 2008). In a particularly favourable embodiment, these sequences are modified so as to exclude the RF pulse(s) generating coherences (transverse magnetisation) on the target nucleus (e.g. $^{13}C$) in the polarisation transfer sequence. Application of the RF pulse to the target nucleus is delayed until the hyperpolarised species reaches the target location for the MR experiment or imaging data acquisition. Thus polarization is preserved along the magnetic z-axis, and only affected by longitudinal relaxation time $T_1$. To avoid asymmetric NMR signals, phase cycling schemes can be applied during the MR data acquisition.

The hyperpolarisation of the nuclei of the recipient-compound have longer (longitudinal) lifetimes ($T_1$) than that of the nuclei of the source-compound, so that more time is available between the hyperpolarisation of the recipient compound and the administering to the patient to be examined as a contrast agent.

According to one aspect of the invention, the source compound is dissolved at a high concentration in an appropriate, non-toxic solvent for efficient hyperpolarisation by interaction with the OAM photonic beam. Here, the orbital angular momentum quantum number of the OAM photonic beam can be selected to optimise the transfer of orbital angular momentum from the photons to the source-compound containing spins with a high gyromagnetic ratio. The spin polarisation on the source-compound is transferred by the NMR polarisation transfer system onto the dissolved recipient-compound, which may have a low gyromagnetic ratio. In this way a large quantity of solvent or solute can be hyperpolarised, have the hyperpolarisation transferred to a smaller quantity of solute, so that a hyperpolarised solute is made, but at low concentration in the solvent so that toxic concentrations are not reached. The hyperpolarised solution is then employed as the contrast agent. In a related approach, the compound is hyperpolarised by way of interaction with the OAM photonic beam at elevated temperature to increase the maximum concentration of the solute source and/or recipient compound when irradiated by the OAM photonic beam.

In yet another implementation the OAM photonic beam first polarises a source-nucleus in a compound and then the polarisation is transferred to a recipient-nucleus in the same compound. In this example the source-compound and the recipient-compound coincide.

In a further implementation, there is no need for transfer of the hyperpolarisation, where the compound is hyperpolarised by way of interaction with the OAM photonic beam at high concentration and then simply diluted in a passive solute so as to avoid toxic concentrations to be exceeded.

In another embodiment of the invention, the chamber is a flow cell or a flat cuvette. The flow-cell can be operated in a continuous flow mode in which a steady flow of hyperpolarised compound is produced. In another example, the flow cell is provided with an output valve at an output port to control the hyperpolarised compound to be provided in discrete batches. Preferably, also an input valve is provided at an input port of the flow cell to more accurately control the discrete batch delivery of the hyperpolarised compound. For example, the flow-cell can be set-up as a so-called lab-on-a-chip. This approach allows drastic miniaturisation of the equipment to dispense the hyperpolarised substances. Lab-on-a-chip is a concept based on microfluidics to manipulate small amounts of fluids (nanoliters $10^{-9}$ l to atto-liters) $10^{-18}$ l using channels with dimensions of 10-100 μm. Lab-on-a-chip can be used with very small quantities of samples and reactants to perform analysis, to carry out separations and detections with high resolution and sensitivity. Further details of lab-on-a-chip are found in the paper 'The origins and the future of microfluidics', by G. M. Whitesides, Nature 442 (2006) 368-373. Integration of OAM photonic beam hyperpolarisation and lab-on-chip NMR allows for high-sensitivity selective spectroscopic characterization of chemical or biological samples.

After interaction with the photonic-OAM beam, the hyperpolarised compound can be administered to the patient to be examined using techniques that are also used in conventional contrast enhanced imaging (CE-CT, CE-MRI). In an embodiment the flow-cell is coupled to a dispensing unit by way of a valve-system which can be controlled to operate in a batch mode or in a continuous flow mode. In the batch mode a bolus of hyperpolarised material is administered, e.g. injected, similar to conventional contrast enhanced (CE) MR imaging procedures. For example a dispensing unit is coupled to an output port of the flow cell. The dispensing unit, such as a power injector or an infusion system, then administers the hyperpolarised compound to the object, e.g. the patient to be examined. Alternatively, the dispensing unit can be coupled to an input port of the flow cell. Then, the dispensing unit delivers the compound in a controlled fashion to the flow cell, where the photonic OAM beam generates hyperpolarisation and the hyperpolarised compound is then administered to the patient to be examined.

In a further example, several flow-cells are provided to operate in parallel to increase the volume flow rate of hyperpolarised material.

A further advantage of the present invention is that the hyperpolarisation process on the basis of OAM photonic beam, notably when applied to a $^{13}C$ compound is hardly sensitive to the specific labelling position of the $^{13}C$ nucleus in the $^{13}C$ compound. Accordingly, this aspect of the invention relieves limitations on the specific compounds that can be hyperpolarised. That is, the present invention does not pose restrictions on particular metabolically relevant compounds that can be labelled with a $^{13}C$ hyperpolarised nucleus. Examples of such metabolically relevant compounds are glucose, pyruvate, bicarbonate, lactate, glutamine, choline etc. Additionally, drugs or artificial blood substances like perfluoro carbons and PFOB (perfluorooctyl bromide) can be hyperpolarised prior to injection. Hence, the present invention enables the examination by way of hyperpolarised enhanced contrast magnetic resonance imaging of a wide variety of metabolic and physiological processes.

The invention also pertains to a magnetic resonance examination system that is provided with a dispenser of the invention. According to a related aspect, the magnetic resonance examination system and the dispenser are provided with a synchroniser control to synchronise the operation of the RF system 901 (see FIG. 1) and gradient system 902 (see FIG. 1) of the magnetic resonance examination system with the operation of the RF-polariser subsystem 4 (see FIG. 1) of the dispenser. The synchronisation is arranged so that the RF (B1) field of the polariser unit is activated to excite the hyperpolarised recipient nuclei in the dispensing unit when there is no disturbing RF and gradient magnetic field pulse of the magnetic resonance examination system. Alternatively, a RF and/or gradient screen 904 (see FIG. 1) e.g. of aluminum or copper can be provided to shield the hyperpolarised secondary nuclei from the RF and/or gradient magnetic fields of the magnetic resonance examination system.

In a further aspect of the invention a magnetic field is applied in the dispenser. Notably, in this aspect of the invention the transfer path passes through this magnetic field from the chamber in which the OM photonic beam and the (optional) polarisation transfer system in which the hyperpolarisation is transferred from the source-compound to the recipient-compound. This direction of the magnetic field is a preferred direction of the polarisation generated by the OAM photonic beam. This is achieved for example when the dispenser is located in the fringe field of the main magnet 903 (see FIG. 1) of the magnetic resonance examination system. Notably, a magnetic field of 0.2 T to 0.5 T or even 1.0 T maintains the generated polarisation and is easy to achieve in a magnetic resonance examination system. These field strengths are available in the fringe field of the main magnet 903 as illustrated in the example of FIG. 2. The magnetic field in the dispenser maintains the hyperpolarisation is maintained when the hyperpolarised compound is transferred out of the OAM photonic beam. For the embodiment where NMR pulse sequences are employed to transfer spin polarisation from high gyromagnetic ratio spins to low gyromagnetic ratio spins, the use of small volumes is advantageous to avoid effects of spatial inhomogeneity of the magnetic field in the NMR polarisation transfer sequence. In practice, the OAM photonic beam for example has an incident spot of 20-50 μm and up to 1000 spots may be used in parallel to achieve polarisation at a distinct location in a gross volume of about 10 cc. In such a small volume spatial inhomogeneities of the magnetic field are not relevant and the fringe field of the main magnet 903 can be used for NMR polarisation transfer after OAM hyperpolarisation. Alternatively, the dispenser is provided with its own magnet system which generates the magnetic field in the chamber.

In a further application of the invention, water is hyperpolarised by the OAM photonic beam at appropriate optical wavelengths, e.g. in the far-red spectrum, and administered, e.g. injected or infused as a bolus. Detection of an arterial input function, and quantification of $T_1$, allows for quantification of perfusion in tissue. Multiple bolus injections can be used to improve SNR, since the water signal decays with $T_1$ or can be crushed by MRI pulse sequences. The technique can easily be combined with DCE-MRI (after injection of the hyperpolarized water), and thus combined perfusion and permeability maps can be obtained.

An injector is used for intravenous administration of isotonic saline solutions, which are hyperpolarised on the basis of OAM polarization. A volume flow rate of 10 ml/s at reasonable degrees of polarization (>20%) can readily be achieved. A first implementation includes: dynamic scan acquisition of the region of interest, either 2D or 3D, monitors passage of the hyperpolarized water bolus; use low flip angle 3D gradient echo sequence to prevent rapid decay of the magnetization; combination with profile sharing techniques like keyhole and VIPR, and reconstruction using Compressed Sensing to allow for high resolution 4D images. The reference image(s) can be obtained in two modes: multiple water boluses and acquisition timed relative to injection to ensure equal signal levels, or semi-steady state injection of polarized water.

An additional application of this method allows for input function quantification: Use time stamping for injector and imaging device to get accurate information on time of arrival, and bolus dispersion.

A second implementation includes subtraction techniques, esp. for perfusion imaging such as:
1. Hyperpolarized water with magnetization along B0 (positive (enhanced) signal) versus baseline signal (thermal equilibrium MRI).
2. Hyperpolarized water with magnetization along B0 (positive enhanced signal) versus magnetization opposite to B0 (negative enhanced signal). The latter is possible due to the polarity effect of the OAM polarization method. Typical readout strategies involve single shot EPI with slice order opposite to flow direction.

Both methods can be applied in a repetitive bolus mode ("pulsed") or using steady supply of polarized water ("continuous"), similar to techniques used for arterial spin labelling.

Typical transit times from the arm to the region of interest (brain, rentals) are 6-12 seconds. Thus, and assuming a $T_1$ of 1.5 seconds, a residual signal level of 3-10× the thermal equilibrium (non-polarized) magnetisation is achievable. For perfusion studies in the brain, using inversion (and subtraction) of the thermal equilibrium magnetization, signal differences of approx 1% are measured, and multiple averages are needed to get to acceptable SNR levels (3-4 minutes scan time). The OAM-hyperpolarisation will allow for scan time reduction by approximately 1 order of magnitude, thus reducing sensitivity to motion artefacts, or allowing to increase SNR by additional averaging.

Similar to known techniques like PULSAR (X. Golay et al. Magnetic Resonance in Medicine 2005, 53: 15-21), multiple time points can be acquired to allow for model free quantification of the perfusion. Regional perfusion can be assessed by selectively applying saturation pulses to feeding arteries.

These and other aspects of the invention will be elucidated with reference to the embodiments described hereinafter and with reference to the accompanying drawing wherein

DETAILED DESCRIPTION OF THE PREFERRED EMBODIMENTS

Figure 1:
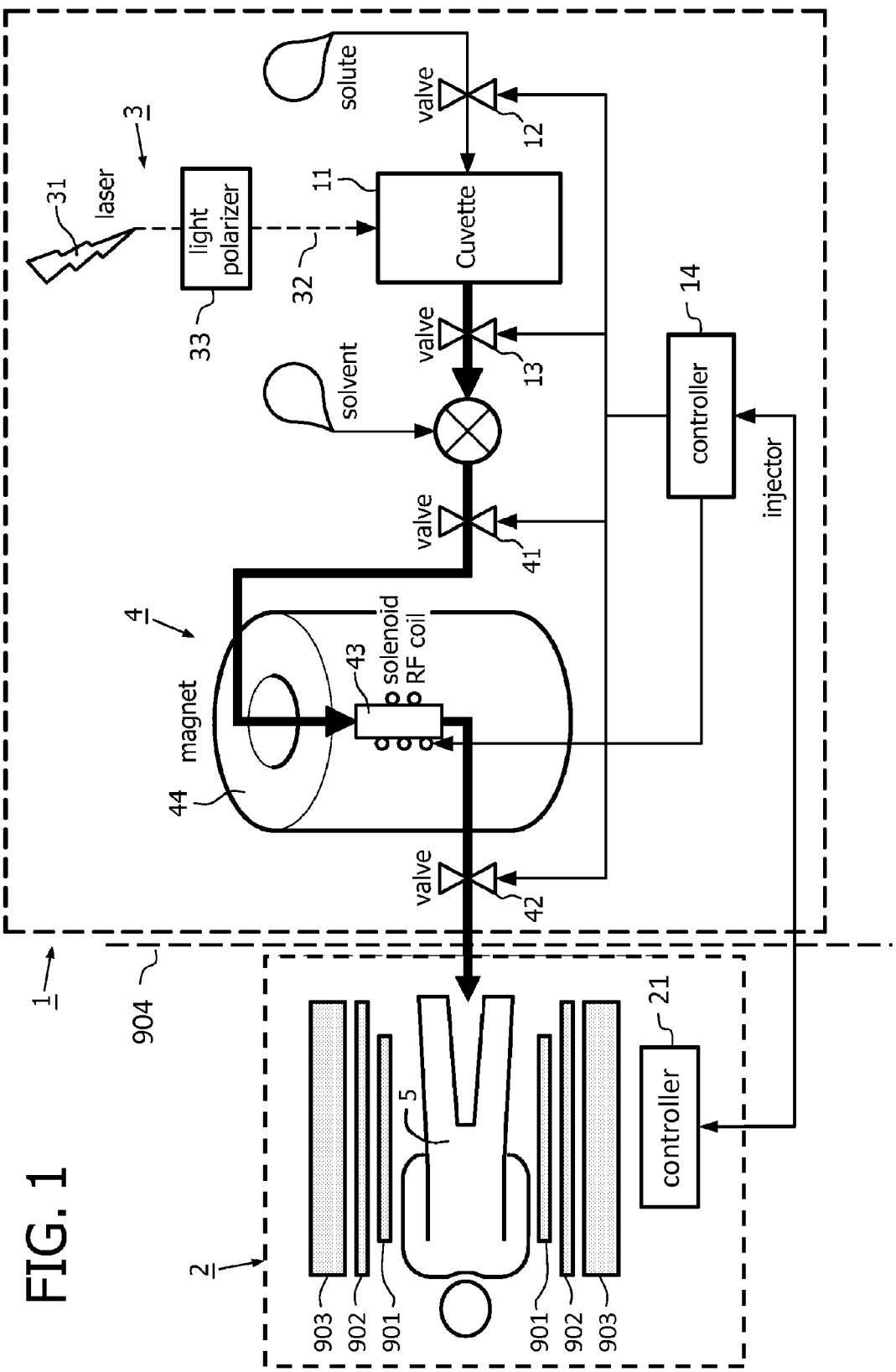
FIG. 1 shows a schematic representation of a dispenser of the invention in co-operation with a magnetic resonance examination system.
Figure 2:
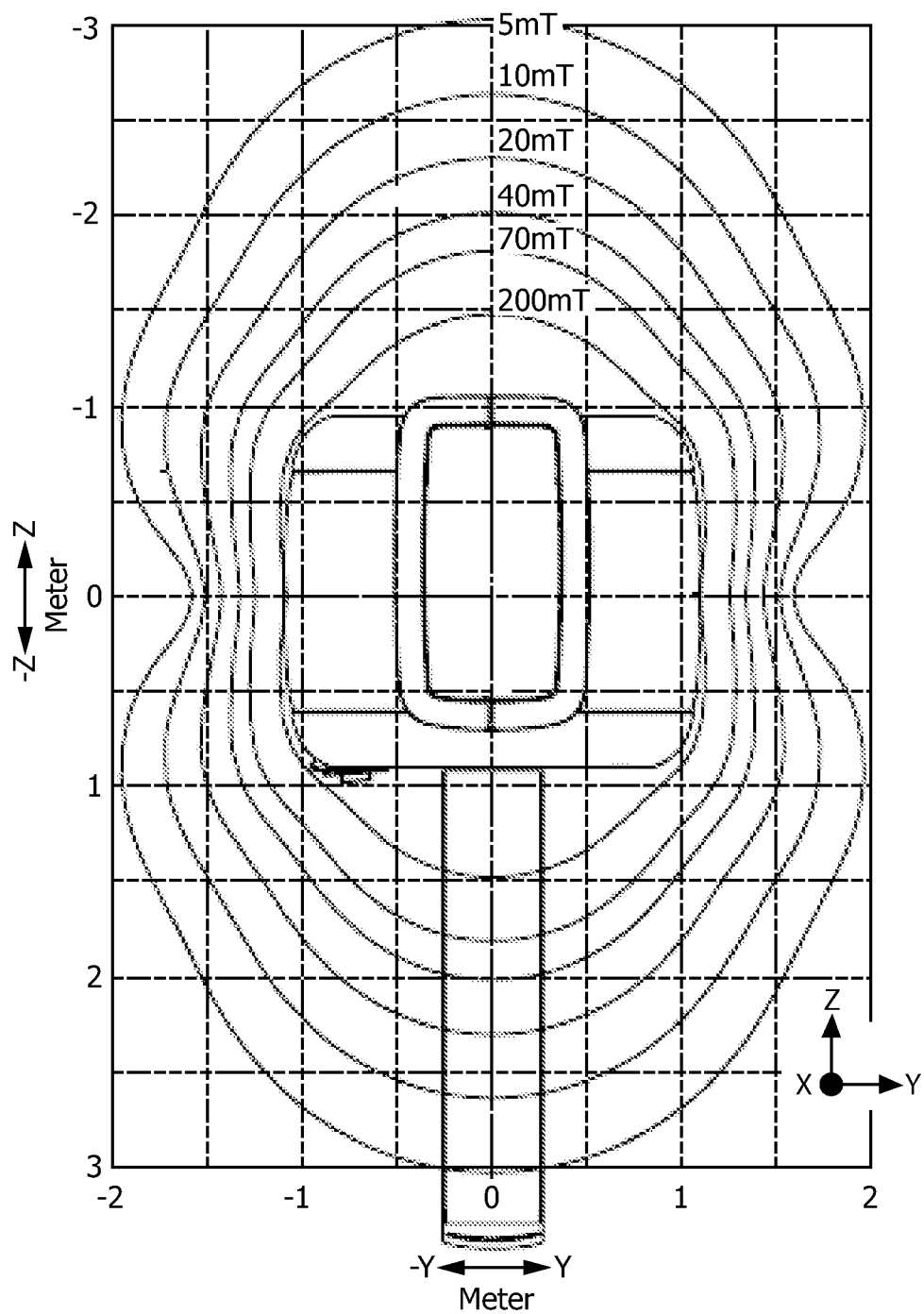
FIG. 2 shows a graphical representation of pulse sequences employed in the polarisation transfer system of the dispenser of the invention.

FIG. 1 shows a schematic representation of a dispenser 1 of the invention in co-operation with a magnetic resonance examination system 2. The chamber 11 of the dispenser 1 is formed as a cuvette 11. The photonic hyperpolarisation system 3 includes a laser 31 and a light polariser 33 which forms the OAM photonic beam 32 that is endowed with orbital angular momentum. This OAM photonic beam is directed into the cuvette 11 which contains the source-compound in the form of the solute, so that in the cuvette the hyperpolarised source-compound is formed. This hyperpolarised source-compound is then fed to the polariser transfer system 4. In the polariser transfer system 4, the hyperpolarisation of the solute source-compound is transferred, e.g. by nuclear polarisation transfer, to the recipient-compound that is added as a solute to the solvent. The hyperpolarised solution with the hyperpolarised solute recipient-compound is then applied to a dispensing unit (not shown) to be administered to the patient to be examined 5. Instead of a human patient, also animals, notably rodents may be examined. The polarisation transfer system 4 of the example is fitted with its own magnet 44 to generate a steady magnetic field to maintain spin orientation for the hyperpolarised molecules or nuclei of the hyperpolarised compound after the polarising OAM photonic beam is switched off, or the hyperpolarised compound has been moved out of the region where interaction with the OAM photonic beam occurs. An RF subsystem including a solenoid RF coil 43 can generate RF EM fields to transfer the polarisation from the source-compound to the recipient compound or from the source-nucleus to the recipient-nucleus within the same compound, e.g. from $^1H$ to $^{13}C$ in glucose.

The dispenser of the invention as shown in FIG. 1 is fitted with several valves 12,13,41,42 to control the flow of the compounds. The input valve 12 of the cuvette controls the inflow of solute into the cuvette where hyperpolarisation is generated by interaction with the OAM photonic beam. The output valve 13 of the cuvette controls the outflow of hyperpolarised solute to the polarisation transfer system. The polarisation transfer system also has an input valve at 41 its input port and an output valve 42 at its output port.

The magnetic resonance examination system 2 has its own MR-controller 21 to perform several functions to operate the magnetic resonance examination system, e.g. to control the application of gradient magnetic fields pulses, RF excitation, inversion or refocusing pulses, i.e. the execute acquisition sequences. Also the MR-controller controls the pick-up of magnetic resonance signals, transfer and processing of these magnetic resonance signals and reconstruction of magnetic resonance image from the signals. The dispenser 1 is provided with a polarisation-controller 14 which controls the various functions of the dispenser 1. The MR-controller 21 and the polarisation-controller 14 are in communication so as to provide a time synchronisation between the magnetic resonance examination system 2 and the dispenser 1 so as to avoid interferences notably by the RF field of the polarisation system 4 on the acquisition sequences and signal read-out of the magnetic resonance examination system. One option is to have the operation of the magnetic resonance examination system controlled by the MR-controller also control the dispenser. Alternatively, the polarisation-controller can be employed to trigger the operation of the magnetic resonance examination system.

Figure 3:
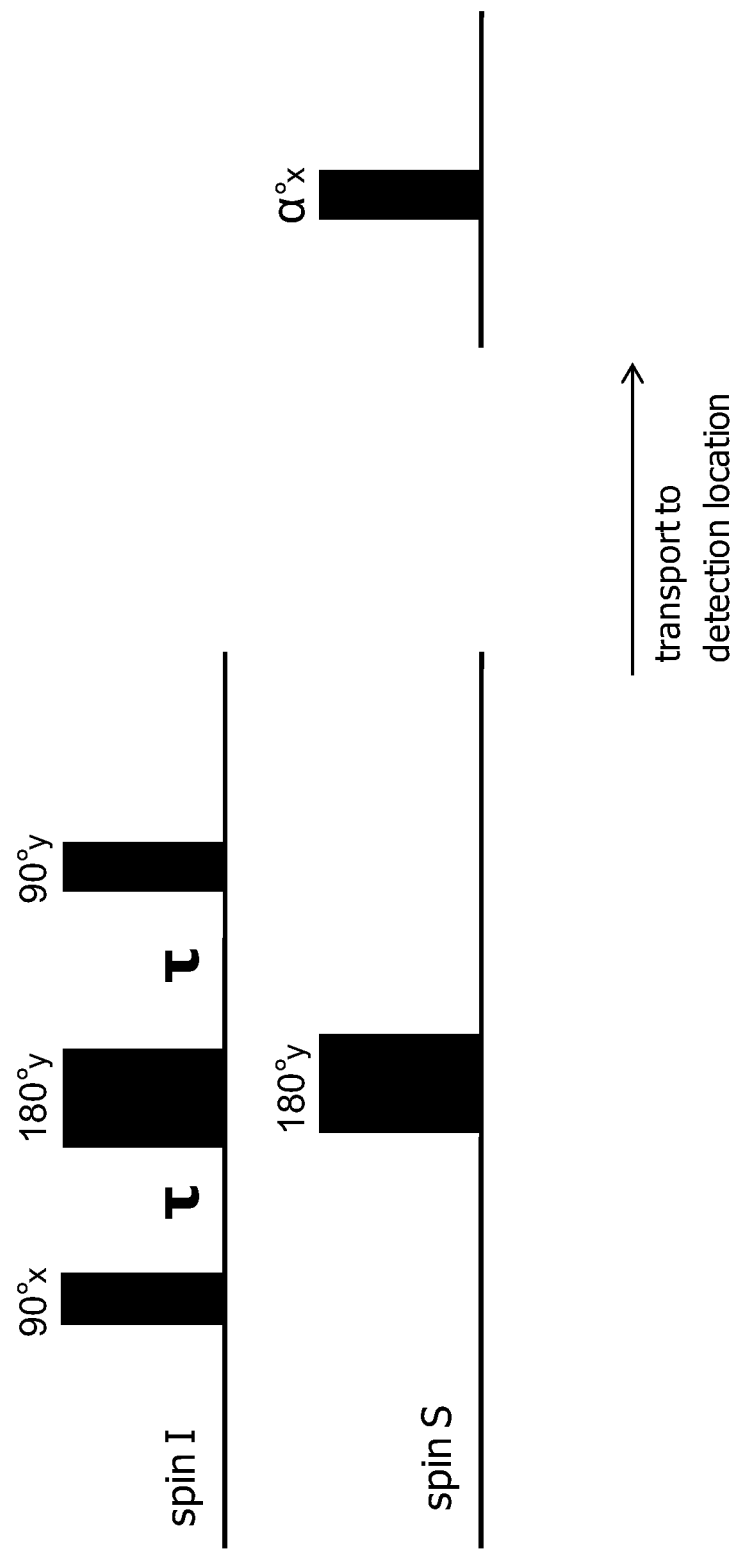
FIG. 3 shows an example of a modified INEPT sequence to transfer polarisation from spin I (e.g. $^1$H) to spin S (e.g. $^{13}$C).

The polarisation system operates on the basis of nuclear polarisation transfer methods like modified INEPT, see FIG. 3. The modification resides in measures to keep the polarisation of the recipient-compound, e.g. on the $^{13}C$ nucleus, along the longitudinal axis, i.e. along the direction of the magnetic field in the chamber. Only when applied as the contrast agent in the magnetic resonance examination system the hyperpolarised nucleus is flipped to a transverse component. The modified INEPT sequence of which a first example of the pulse sequence is shown in trace a of FIG. 3 uses the magnetisation of a nucleus with a high gyromagnetic ratio, e.g. $^1H$, $^{19}F$ or $^{31}P$, to enhance the weak magnetic resonance signals of a nucleus with a low gyromagnetic ratio, e.g. $^{31}C$, $^{15}N$, $^{17}O$. The nuclear spin of the source compound that has a high gyromagnetic ratio (e.g. 1H) is orientated along the z-axis and then rotated over 90° about the x-axis, thus transverse magnetisation of the source compound is generated. By J-coupling between the nucleus with a high gyromagnetic ratio of the source compound and the nucleus with a low gyromagnetic ratio of the recipient compound magnetisation is transferred from the compound to the recipient-compound. This transfer is enhanced by the modified INEPT sequence. After the initial excitation by the 90× pulse the spin system is left to evolve for a free precession interval T equal to J/4 and then both the nuclear spins of the compound and the recipient-compound are refocused by 180× pulses which retains the refocused magnetisation of the recipient-compound along the z-axis. In an alternative modified INEPT pulse sequence repeated restore pulses are applied driving the magnetisations of both the source-compound and of the recipient-compound to a driven equilibrium state.

The invention claimed is:

1. A dispenser comprising:
   a chamber configured to receive a source compound; and
   a photonic hyperpolarization system configured to generate an orbital angular momentum-photonic beam endowed with orbital angular momentum and arranged to direct the orbital angular momentum-photonic beam into the chamber so as to generate nuclear hyperpolarization in the source compound to produce a hyperpolarized source compound,
   wherein the chamber has an output over which the hyperpolarized source compound can be dispensed.

2. The dispenser of claim 1, further comprising a polarization transfer system configured to:
   receive the hyperpolarized source compound from the chamber;
   receive a recipient compound; and
   transfer the hyperpolarization from the hyperpolarized source compound onto the recipient compound.

3. The dispenser of claim 2, wherein the recipient compound includes at least one selected from the group consisting of carbon, nitrogen, oxygen, and fluorine, and wherein the hyperpolarization is transferred to a nucleus of the at least one selected from the group consisting of carbon, nitrogen, oxygen, and fluorine.

4. The dispenser of claim 1, wherein the chamber is a flow cell configured for passage of a fluid.

5. The dispenser of claim 4, wherein the flow cell comprises at least one chosen from the group consisting of an input port having an input valve and an output port having an output valve.

6. The dispenser of claim 1,
   wherein the chamber is a flat cuvette.

7. The dispenser of claim 1, wherein a magnetic field is applied in the dispenser.

8. The dispenser of claim 1, further comprising a magnet configured to generate a magnetic field in the dispenser.

9. The dispenser of claim 1, wherein the source compound comprises water, and the orbital angular momentum-photonic beam generates nuclear hyperpolarization in hydrogen protons in the water.

10. The magnetic resonance examination system of claim 1, wherein the source compound comprises water which includes hydrogen protons, wherein the orbital angular momentum-photonic beam generates nuclear hyperpolarization in the hydrogen protons.

11. A magnetic resonance examination system, comprising:
   a dispenser, comprising:
      a chamber configured to receive a source compound; and
      a photonic hyperpolarization system configured to generate an orbital angular momentum-photonic beam endowed with orbital angular momentum and arranged to direct the orbital angular momentum-photonic beam into the chamber so as to generate nuclear hyperpolarization in the source compound to produce a hyperpolarized source compound, wherein the chamber has an output over which the hyperpolarized source compound can be dispensed;
   a main magnet configured to generate a static magnetic field;
   a radio frequency system configured to generate radio frequency pulses;
   a gradient system configured to produce magnetic gradient field pulses; and a synchronization control configured to synchronize an operation of a radio frequency polarizer-subsystem with the gradient system and the radio frequency system.

12. The magnetic resonance examination system of claim 11, wherein the chamber of the dispenser is located in a magnetic field of the main magnet.

13. The magnetic resonance examination system of claim 11, further comprising a gradient shield disposed between the gradient system and the dispenser.

14. A method, comprising:
providing a source compound to a chamber;
generating an orbital angular momentum-photonic beam endowed with orbital angular momentum;
directing the orbital angular momentum-photonic beam into the chamber so as to generate nuclear hyperpolarization in the source compound to produce a hyperpolarized source compound; and
dispensing the hyperpolarized source compound over an output of the chamber.

15. The method of claim 14, further comprising:
receiving the hyperpolarized source compound from the chamber;
receiving a recipient compound; and
transferring the hyperpolarization from the hyperpolarized source compound onto the recipient compound to produce a hyperpolarized recipient compound.

16. The method of claim 15, further comprising applying a magnetic field to the hyperpolarized recipient compound.

17. The method of claim 16, further comprising administering the hyperpolarized recipient compound to a subject in a magnetic resonance examination system.

18. The method of claim 17, further comprising performing a magnetic resonance examination of the subject while hyperpolarized recipient compound is provided to the subject.

19. The method of claim 15, wherein the recipient compound includes at least one item selected from the group consisting of carbon, nitrogen, oxygen, and fluorine, and wherein the hyperpolarization is transferred to a nucleus of the at least one item selected from the group consisting of carbon, nitrogen, oxygen, and fluorine.

20. The method of claim 14, wherein the source compound comprises water which includes hydrogen protons, and the orbital angular momentum-photonic beam generates nuclear hyperpolarization in the hydrogen protons.

* * * * *